United States Patent [19]

Mosch

[11] Patent Number: 5,066,223
[45] Date of Patent: Nov. 19, 1991

[54] MELTING AND CASTING FURNACE

[75] Inventor: Johannes Mosch, Alzenau, Fed. Rep. of Germany

[73] Assignee: Leybold Aktiengesellschaft, Hanau I, Fed. Rep. of Germany

[21] Appl. No.: 612,629

[22] Filed: Nov. 13, 1990

[30] Foreign Application Priority Data

Jul. 13, 1990 [DE] Fed. Rep. of Germany ....... 4022389

[51] Int. Cl.⁵ .......................... F27D 3/12; F27B 17/00
[52] U.S. Cl. .................................. 432/184; 432/241; 432/161
[58] Field of Search .................. 432/205, 161, 241, 77, 432/81, 10, 62, 123, 184

[56] References Cited

U.S. PATENT DOCUMENTS

| 2,869,856 | 1/1959 | Greene | 432/241 |
| 3,463,470 | 8/1969 | Green et al. | 432/241 |
| 3,867,093 | 2/1975 | Huttermann | 432/241 |
| 4,848,420 | 7/1989 | Classen | 432/161 |

Primary Examiner—Henry C. Yuen
Attorney, Agent, or Firm—Felfe & Lynch

[57] ABSTRACT

A melting and casting furnace (1) for the production of directionally solidified or monocrystalline structures includes a housing (2) having a heating apparatus (3), and a cooling ring (4) disposed thereunder, as well as a cooling table (5) for the placement of a mold (6). Numerous radiation shields (8) in a heating zone in the housing, at a distance apart from one another and steer the heat rays onto a small area (A) in order to prevent direct radiation onto the metal already solidified or solidifying. In this manner the temperature gradient between the solidified and the molten can be kept great.

9 Claims, 2 Drawing Sheets

MELTING AND CASTING FURNACE

BACKGROUND OF THE INVENTION

The invention relates to a melting and casting furnace for the production of directionally solidified or monocrystalline structures, having a heating apparatus provided in a housing and a cooling ring disposed beneath it, as well as a cooling table for holding a mold, a shield being provided in the area of a first heating zone between the mold and the cooling ring and separating the heating zone from the cooling zone.

A vacuum, induction, melting and casting furnace for the production of directionally solidified or monocrystalline structures is already known (Leybold brochure, "Vakuum-Präzisions-GieBtechnik" ref. No. 32-100.01) which is equipped with a heating and cooling system. The heating and cooling system consists of a two-zone heater with which a controlled input of energy to the material to be melted can be performed. For the production of directionally solidified or monocrystalline structures it is necessary to achieve a steep temperature gradient in an axial flow of heat perpendicular to the liquid-solid boundary surface of the casting. For this purpose the mold is placed on a cooling plate and heated prior to pouring the metal to temperatures above the melting point of the alloy to be cast. An off-bearing device operating with great precision draws the mold filled with the melt out of the heating system at a programmed rate of speed.

SUMMARY OF THE INVENTION

It is the purpose of the invention to improve and arrange the heating and cooling system such that the temperature gradient in the zone between the molten metal and solidified metal increases. This purpose is achieved by the fact that in the heating zone a plurality of radiation shields arrayed together are provided, which are arranged at a distance apart from one another and shade the heat rays away from the cooling zone. In the use of the individual radiation shields stray radiation is prevented, so that a steep temperature gradient can establish itself in the zone between molten metal and solidified metal. By shading out the stray radiation, direct radiation against the mold portion containing the casting that has already solidified or is solidifying is prevented. The very great temperature drop in the zone between the solidified and the molten metal has an advantageous effect on the solidification process, and substantially improves the microporosity of the solidified casting.

According to a special feature provision is made for the radiation shields to be arranged perpendicular to the longitudinal central axis of the mold, so that the radiant heat impinges directly on the mold and scattered radiation is prevented.

Another further development of the apparatus in accordance with the invention consists in arranging the individual radiation shields with their inner edge at a distance from the outer wall of the mold, and in arranging the individual radiation shields perpendicular to the longitudinal central axis of the mold. This assures that only a small beam will strike the mold at a very specific point at the transition between the two zones. The temperature drop between the two zones can thus be increased in a simple manner. The newly formed annular gap greatly constricts the radiation path and thus opposes any flattening out of the temperature gradient.

It is desirable that the individual radiation shields be at a uniform distance apart. It is especially significant in the apparatus in accordance with the invention that the individual radiation shields are configured as ring shields which are arranged coaxially with the longitudinal central axis of the mold. It is furthermore advantageous for the individual radiation shields to be configured as ring shields and have different diameters. It is also possible for the radiation shields to have equal diameters.

Lastly, according to a special feature provision is made for the lowermost radiation shield to be disposed in the area of the water-cooled cooling ring or fastened thereon. To improve the installation of the radiation shields it is advantageous in accordance with the invention for the radiation shields to be fastened in a frame and be able to be installed and replaced within the heating apparatus.

DETAILED DESCRIPTION OF THE PREFERRED EMBODIMENT

Figure 1:
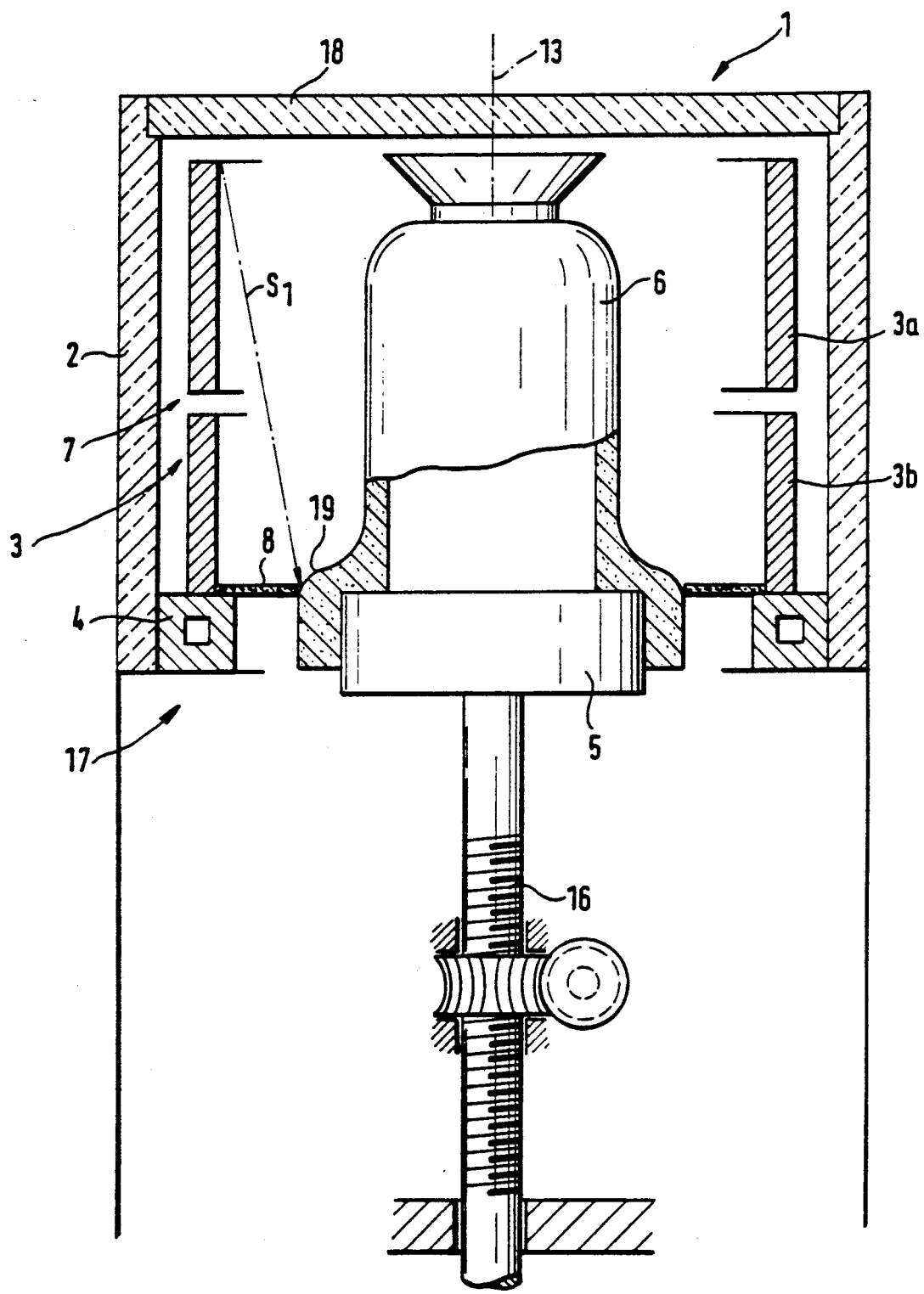
FIG. 1 is a side view of a known melting and casting furnace with a radiation shield.

In the drawing, a melting and casting furnace 1 serves for the production of directionally solidified or monocrystalline structures. The melting and casting furnace 1 consists of a housing 2 indicated only partially in the drawing, which is made of thermal insulating material and whose top is covered with a lid 18.

Inside of the housing 2 there is provided a heating and cooling apparatus 3 with which several resistance heating elements 3a and 3b are associated. The resistance heating elements 3a and 3b are arranged ring-wise in the housing and surround a mold 6. The heating system 3 is configured as a two-zone heating system In the embodiment shown in FIG. 1, a known arrangement of a melting and crucible furnace 1 is represented, which is equipped with only one radiation shield 8, while in the embodiment shown in FIG. 2, numerous radiation shields 10 are provided. The differences will be discussed below.

The mold 6 is set down on a cooling table 5. The latter is arranged on an elevating device 16 indicated only schematically, by means of which the cooling table 5 with the mold 6 supported on it can be shifted between an upper position and a lower position.

The heating zone 7 and the cooling zone 17 are separated from one another according to FIG. 1 by a radiation shield 8. On the mold 6 represented in solid lines it can be seen that the radiation shield 8 reaches the outside of the mold, so that no heat rays pass from the upper heating zone 7 to the lower cooling zone 17.

Figure 2:
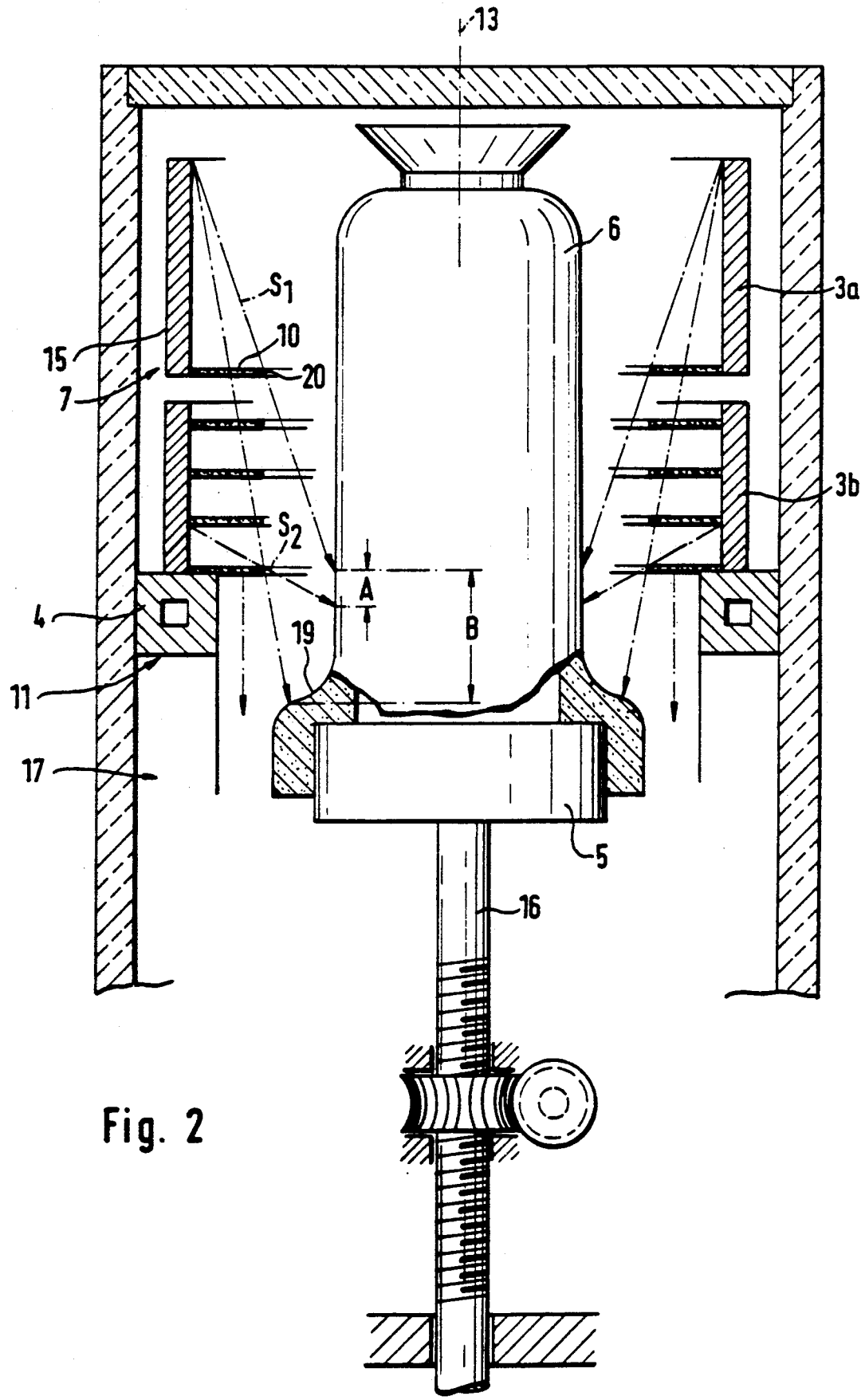
FIG. 2 is a side view of the melting and casting furnace with numerous radiation shields arranged one under the other.

According to FIGS. 1 and 2, the lifting device 16 for holding a cooling table 5 is in an upper position. In this position the cooling table 5 with the mold 6 placed on it is perfectly sealed off. In the heating zone 7 the casting metal is only kept molten by the heater 3a. If now the cooling table with the mold 6 is lowered gradually during the solidification process, an annular gap first forms between the radiation shield 8 and the mold 6, since the flaring skirt 19 of the mold moves away from the radiation shield as it is lowered. But since no thermal energy is being delivered in concentrated form to the already solidified material in the solid zone, numerous ring-shaped radiation shields 10 are arranged, in accordance with the invention, perpendicular to the longitudinal central axis 13 of the mold 6. The radiation shields 10 are disposed at a distance from the exterior of the mold 6 and thus with their inner edges 20 they form an annular gap over the entire length of the mold 6. Advantageously, the individual radiation shields 10 are arranged at right angles to the longitudinal central axis 13 of the mold 6. They can be at a uniform distance apart from one another.

As it can be seen in FIG. 1, the ray path $S_1$ runs down into the bottom area of the mold 6 and strikes the skirt 19 For the production of directionally solidified or monocrystalline structures it is necessary to achieve a high temperature gradient and an axial flow of heat perpendicular to the molten solid boundary surface. For this purpose the mold is placed on the cooling table 5 and heated before pouring to temperatures above the melting point of the alloy that is to be cast. An off-bearing system operating with great precision, which is not represented in the drawing, carries the mold 6, filled with the molten metal, out of the heating apparatus at a programmed rate of speed. To keep the annular gap that normally forms between the radiation shield 10 and the mold 6 small, numerous radiation shields 10 are provided one over the other as shown in FIG. 2. From the ray paths $S_1$ and $S_2$ in FIG. 2 it can be seen that the heat rays strike the outside of the mold 6 only in a small area A. If the radiation shields 10 were not present, a substantially greater area B would be heated by the heater. By preventing the direct irradiation (area B) on the mold 6 in accordance with FIG. 2, containing the already solidified or solidifying metal, the temperature drop between the solid zone and the molten zone is greatly increased and thus the temperature gradient is necessarily steeper.

In the embodiment of FIG. 2, five radiation shields 10 are disposed one over the other. Depending on the configuration, height and width, additional radiation shields 10 can be provided. Thus it is conceivable to provide radiation shields over the entire length of the mold 6 or the housing 2. The radiation shields 10 are advantageously held together in a frame not shown in the drawing, and they can be inserted between the heating system 3 and the mold 6. It is furthermore possible to provide the ring-shaped radiation shields with various inside diameters. The lowermost radiation shield 10 is disposed on a cooling ring 4. The latter is provided in the area of both the zones, the molten and the solid.

With the arrangement according to the invention, a directionally solidified casting of high quality and low microporosity can be achieved, since the negative influence of the stray radiation in the solidified zone is reduced.

What is claimed:

1. Melting and casting furnace for the production of directionally solidified or monocrystalline structures, said furnace comprising
    a housing having a bottom opening with a cooling ring disposed about the perimeter thereof,
    a cooling table with a mold disposed thereon arranged for movement in and out of said housing through said bottom opening,
    heating apparatus in said housing, said apparatus being arranged to heat said mold by radiation, and
    a plurality of radiation shields spaced one above the other in said housing, the lowermost said radiation shield lying above said cooling ring about said bottom opening and separating a heating zone inside said housing from a cooling zone outside said housing, said shields extending from said heating apparatus toward said mold so that radiation from the heating apparatus to the cooling zone is blocked.

2. Furnace as in claim 1 wherein said mold has a longitudinal central axis coincident with the direction of movement in and out of said housing, said radiation shields being substantially planar and disposed perpendicularly to said axis.

3. Furnace as in claim 2 wherein said radiation shields are annular in shape.

4. Furnace as in claim 1 wherein said mold has an exterior wall and said radiation shields have inner edges spaced from said exterior wall.

5. Furnace as in claim 4 wherein said radiation shields are annular in shape, said inside edges being circular.

6. Furnace as in claim 5 wherein said inside edges have a like diameter.

7. Furnace as in claim 1 wherein said radiation shields are spaced a uniform distance apart.

8. Furnace as in claim 1 wherein said lowermost radiation shield is disposed on said cooling ring.

9. Furnace as in claim 1 comprising a frame to which at least some of said radiation shields are attached, said frame being insertable into said heating apparatus.

* * * * *